(12) United States Patent
Jo et al.

(10) Patent No.: US 10,319,792 B2
(45) Date of Patent: Jun. 11, 2019

(54) DISPLAY DEVICE

(71) Applicant: LG Display Co., Ltd., Seoul (KR)

(72) Inventors: Jang Jo, Seoul (KR); Jong-Geun Yoon, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 15/657,021

(22) Filed: Jul. 21, 2017

(65) Prior Publication Data

US 2018/0182817 A1    Jun. 28, 2018

(30) Foreign Application Priority Data

Dec. 28, 2016  (KR) .................. 10-2016-0181124

(51) Int. Cl.
| | |
|---|---|
| H01L 27/15 | (2006.01) |
| H01L 51/52 | (2006.01) |
| G06F 3/041 | (2006.01) |
| G06F 3/044 | (2006.01) |
| H01L 27/32 | (2006.01) |

(52) U.S. Cl.
CPC ............ H01L 27/323 (2013.01); G06F 3/044 (2013.01); G06F 3/0412 (2013.01); H01L 27/15 (2013.01); H01L 27/322 (2013.01); H01L 27/3246 (2013.01); H01L 27/3272 (2013.01); H01L 51/5284 (2013.01); *G06F 2203/04103* (2013.01); *G06F 2203/04111* (2013.01); *G06F 2203/04112* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

| | | | | |
|---|---|---|---|---|
| 2010/0265205 | A1* | 10/2010 | Park .................... | G06F 3/045 345/174 |
| 2011/0193799 | A1* | 8/2011 | Jun ..................... | H01L 27/323 345/173 |
| 2011/0248944 | A1* | 10/2011 | Liu ...................... | G06F 3/046 345/173 |
| 2014/0022467 | A1* | 1/2014 | Chai ................... | G02F 1/13338 349/12 |
| 2014/0061597 | A1* | 3/2014 | Choi ................... | H01L 51/5284 257/40 |
| 2014/0117324 | A1* | 5/2014 | Kim .................... | H01L 27/323 257/40 |
| 2014/0313435 | A1* | 10/2014 | Cho .................... | H01J 9/20 349/12 |
| 2014/0346027 | A1* | 11/2014 | Li ....................... | G06F 3/044 200/600 |

* cited by examiner

*Primary Examiner* — Herve-Louis Y Assouman
(74) *Attorney, Agent, or Firm* — Fenwick & West LLP

(57) ABSTRACT

A thin and lightweight display device is disclosed. The display device includes a black bridge electrically connected to a plurality of touch electrodes disposed on an encapsulation unit, wherein the black bridge is disposed on the encapsulation unit between color filters to also serve as a black matrix, with the result that a cell gap between the black bridge and an anode electrode is reduced when compared with a comparative example, thereby securing a wide viewing angle, and wherein the touch electrodes are disposed on the encapsulation unit, with the result that an additional bonding process is not required, whereby the process is simplified and cost is reduced.

25 Claims, 9 Drawing Sheets

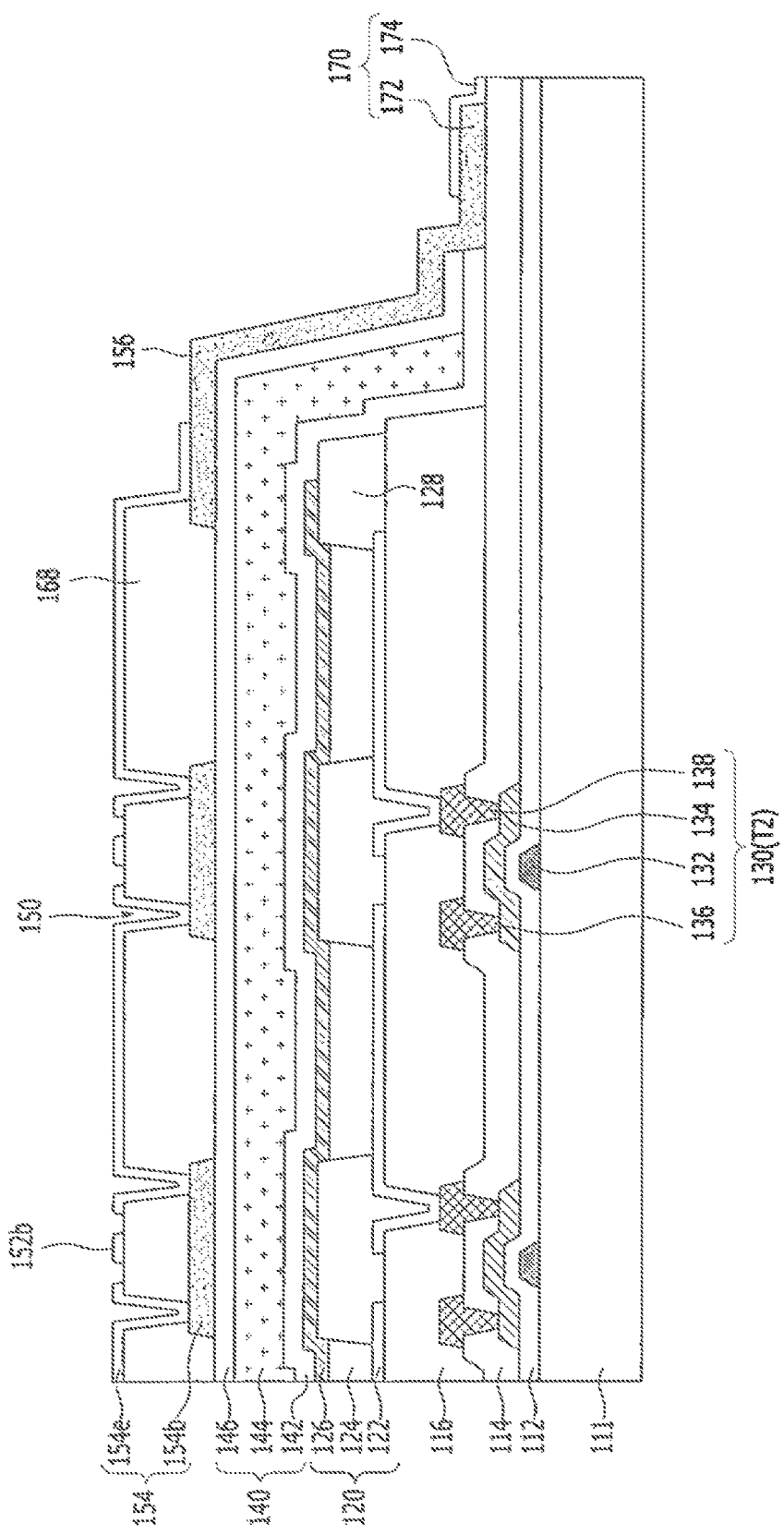

DISPLAY DEVICE

This application claims the benefit of Korean Patent Application No. 10-2016-0181124, filed on Dec. 28, 2016, which is hereby incorporated by reference as if fully set forth herein.

BACKGROUND OF THE INVENTION

Field of the Invention

The present invention relates to a display device, and more particularly to a display device manufactured through a simplified process at reduced cost.

Discussion of the Related Art

A touchscreen is an input device that allows a user to input a command by selecting one of multiple instructions displayed on a screen, such as a display device, using a user's hand or an object. That is, the touchscreen converts a contact position at which the user's hand or the object directly contacts the touchscreen into an electrical signal to receive the instruction selected at the contact position as an input signal. The touchscreen has been increasingly used, since the touchscreen is capable of replacing an additional input device that is connected to the display device for operation, such as a keyboard or a mouse.

In most cases, the touchscreen is generally attached to the front of a display panel, such as a liquid crystal display panel or an organic electro-luminescence display panel, using an adhesive. Since the touchscreen is separately manufactured and is attached to the front of the display panel, the process is complicated and cost is increased due to the addition of an attaching step.

SUMMARY OF THE INVENTION

Accordingly, the present invention is directed to a display device that substantially obviates one or more problems due to limitations and disadvantages of the related art.

An object of the present invention is to provide a display device manufactured through a simplified process at reduced cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device includes a black bridge electrically connected to a plurality of touch electrodes disposed on an encapsulation unit. The black bridge is disposed on the encapsulation unit between color filters to also serve as a black matrix, with the result that a cell gap between the black bridge and an anode electrode is reduced when compared with a comparative example, thereby securing a wide viewing angle. The touch electrodes are disposed on the encapsulation unit, with the result that an additional bonding process is not required, whereby the process is simplified and cost is reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIGS. 5A, 5B, 5C, and 5D are sectional views illustrating a method of manufacturing the organic light-emitting display device having the touch sensor shown in FIG. 3.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
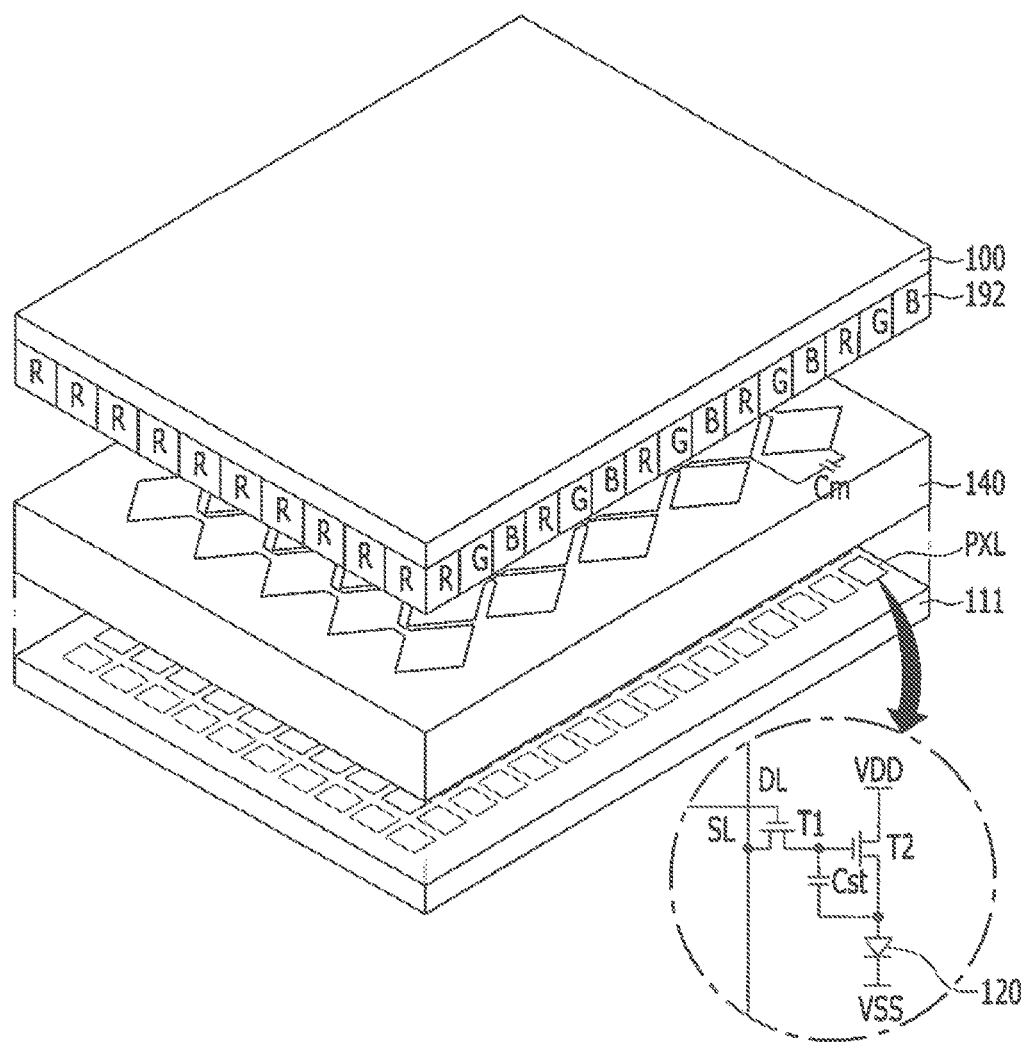
FIG. 1 is a perspective view showing an organic light-emitting display device having a touch sensor according to an embodiment of the present invention.

FIG. 1 is a perspective view showing an organic light-emitting display device having a touch sensor according to an embodiment of the present invention.

Figure 2:
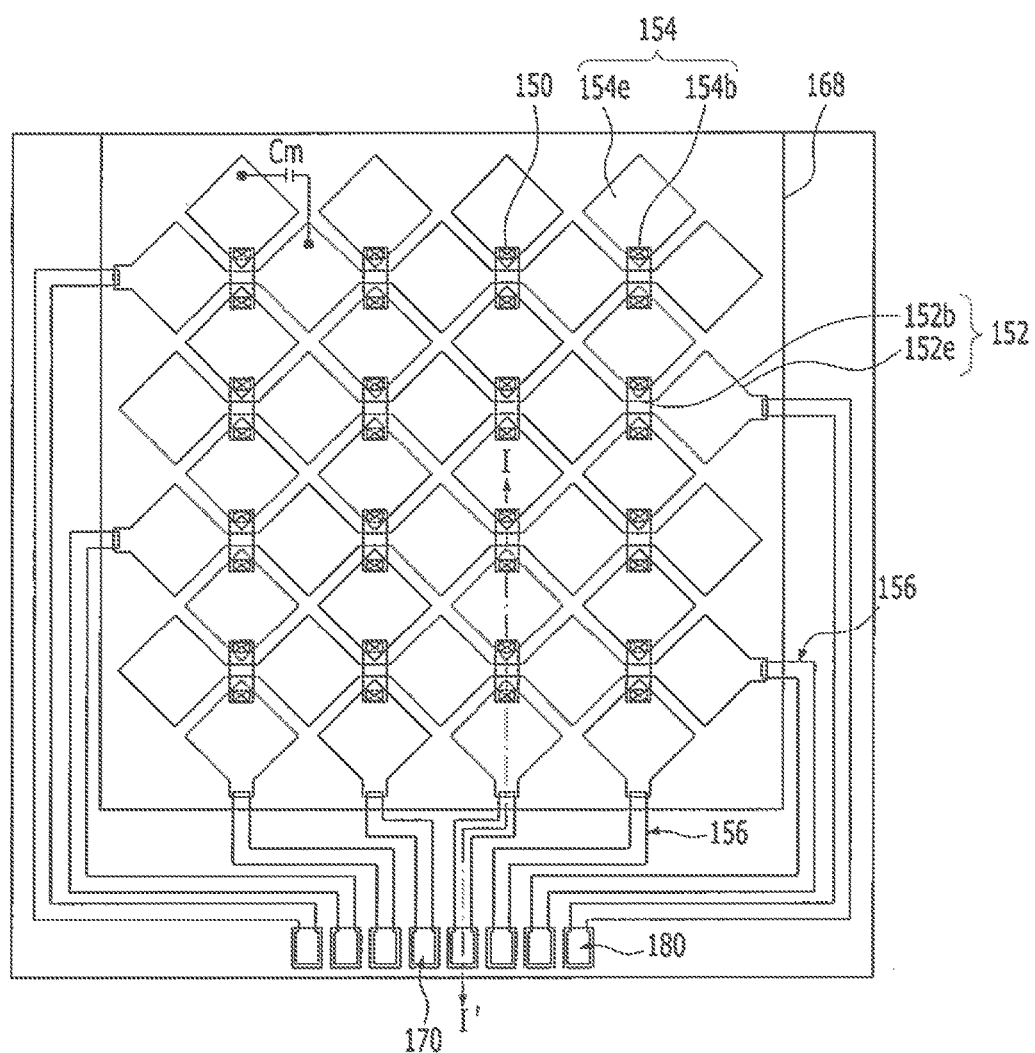
FIG. 2 is a plan view of the organic light-emitting display device having the touch sensor shown in FIG. 1.

The organic light-emitting display device having the touch sensor shown in FIG. 1 detects variation in a mutual capacitance Cm (the touch sensor) due to a user's touch through touch electrodes 152e and 154e shown in FIG. 2 during a touch period to sense whether a touch has been performed and the touched position. The organic light-emitting display device having the touch sensor shown in FIG. 1 displays an image through respective unit pixels each including a light-emitting element 120. Each unit pixel includes red (R), green (G), and blue (B) sub-pixels PXL. Alternatively, each unit pixel may include red (R), green (G), blue (B), and white (W) sub-pixels PXL.

To this end, the organic light-emitting display device shown in FIG. 1 includes a plurality of sub-pixels PXL arranged on a substrate 111 in a matrix fashion, an encapsulation unit 140 disposed on the sub-pixels PXL, a mutual capacitance Cm disposed on the encapsulation unit 140, and a color filter 192 disposed on the mutual capacitance Cm.

Each of the sub-pixels PXL includes a pixel-driving circuit and a light-emitting element 120 connected to the pixel-driving circuit.

The pixel-driving circuit includes a switching transistor T1, a driving transistor T2, and a storage capacitor Cst.

When a scan pulse is supplied to a scan line SL, the switching transistor T1 is turned on to supply a data signal, supplied to a data line DL, to the storage capacitor Cst and a gate electrode of the driving transistor T2.

In response to the data signal supplied to the gate electrode of the driving transistor T2, the driving transistor T2 controls current I supplied from a high-voltage (VDD) supply line to the light-emitting element 120 to adjust the amount of light emitted by the light-emitting element 120. Even when the switching transistor T1 is turned off, the driving transistor T2 supplies uniform current I to the light-emitting element 120 using voltage charged in the storage capacitor Cst such that the light-emitting element 120 keeps emitting light until a data signal of the next frame is supplied.

Figure 3:
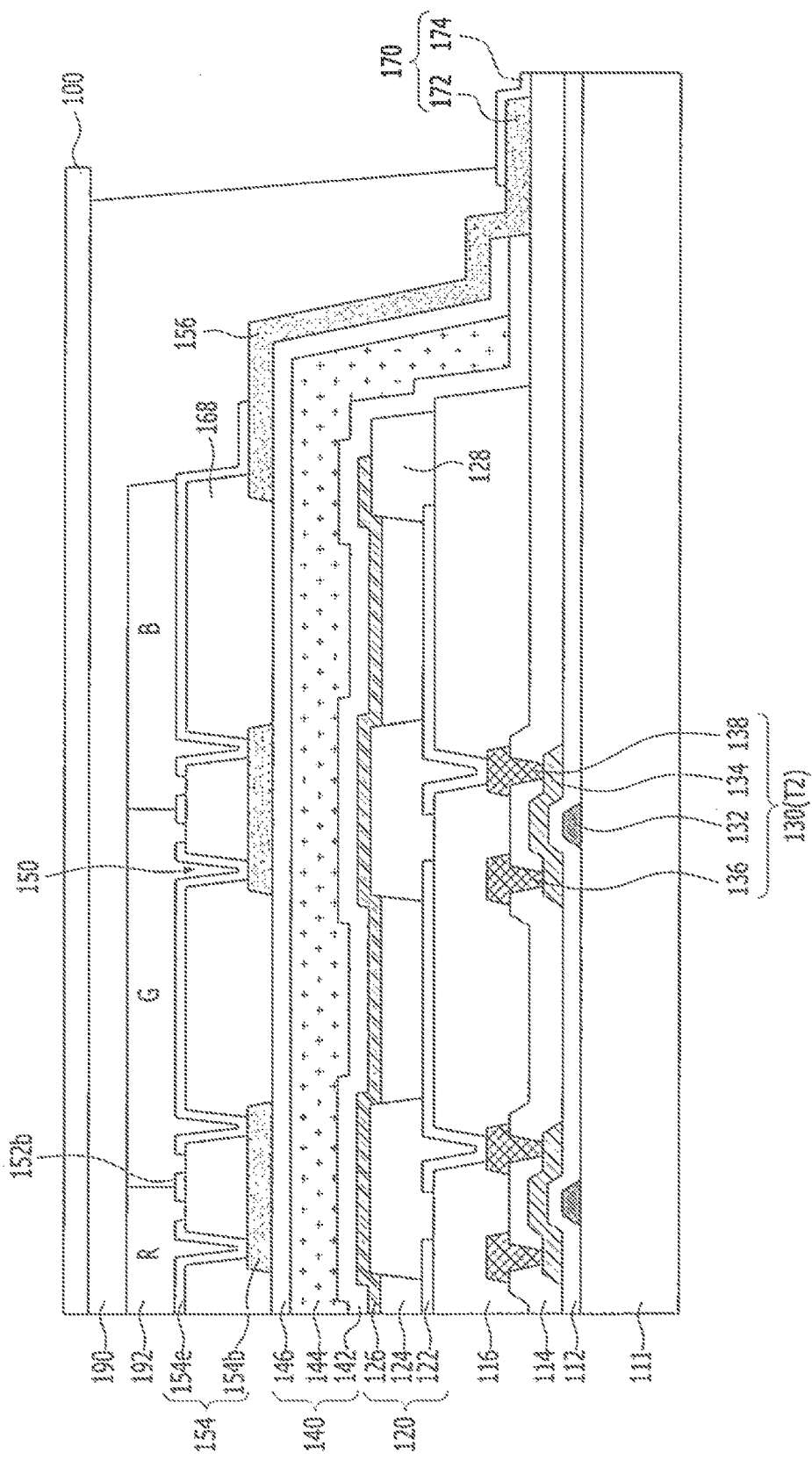
FIG. 3 is a sectional view of the organic light-emitting display device having the touch sensor taken along line I-I' of FIG. 2.

As shown in FIG. 3, the driving thin film transistor T2 (130) includes a gate electrode 132, a semiconductor layer 134 overlapping the gate electrode 132 in the state in which a gate dielectric film 112, which is a first dielectric film, is disposed therebetween, and source and drain electrodes 136 and 138 formed on an interlayer dielectric film 114, which is a second dielectric film, to contact the semiconductor layer 134. The semiconductor layer 134 is formed of at least one selected from among an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin film transistor 130, exposed through a pixel contact hole formed through a passivation film 116, which is a third dielectric film.

The light-emitting stack 124 is formed on the anode electrode 122 in a light-emitting area defined by a bank 128. The light-emitting stack 124 is formed by stacking a hole-related layer, an organic light-emitting layer, and an electron-related layer on the anode electrode 122 in the forward order or in the reverse order. The light-emitting stack 124 may include first and second light-emitting stacks opposite each other in the state in which a charge generation layer (CGL) is disposed therebetween. In this case, the organic light-emitting layer of one of the first and second light-emitting stacks generates blue light, and the organic light-emitting layer of the other of the first and second light-emitting stacks generates yellowish-green light. Consequently, white light is generated by the first and second light-emitting stacks. The white light generated by the light-emitting stack 124 is incident on a color filter (not shown), which is located above or under the light-emitting stack 124, to realize a color image. In a different embodiment, each light-emitting stack 124 may generate colored light corresponding to each sub-pixel without an additional color filter to realize a color image. That is, the light-emitting stack 124 of the red (R) sub-pixel may generate red light, the light-emitting stack 124 of the green (G) sub-pixel may generate green light, and the light-emitting stack 124 of the blue (B) sub-pixel may generate blue light.

The cathode electrode 126 is formed to be opposite the anode electrode 122 in the state in which the light-emitting stack 124 is disposed therebetween, and is connected to a low-voltage (VSS) supply line.

The encapsulation unit 140 prevents external moisture or oxygen from permeating into the light-emitting element 120, which has low resistance to the moisture or the oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is disposed at the uppermost layer. The encapsulation unit 140 includes at least two inorganic encapsulation layers 142 and 146 and at least one organic encapsulation layer 144. In embodiments of the present invention, an encapsulation unit 140 having a structure in which an organic encapsulation layer 144 is disposed between first and second inorganic encapsulation layers 142 and 146 will be described by way of example.

The first inorganic encapsulation layer 142 is formed on a substrate 111, on which the cathode electrode 126 is formed, to be closest to the light-emitting element 120. The first inorganic encapsulation layer 142 is formed of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, the first inorganic encapsulation layer 142 is deposited in a low-temperature atmosphere, whereby it is possible to prevent damage to the light-emitting stack 124, which has low resistance to a high-temperature atmosphere, when the first inorganic encapsulation layer 142 is deposited.

The organic encapsulation layer 144 reduces stress between the layers due to bending of the organic light-emitting device and improves planarization. The organic encapsulation layer 144 is formed of an organic dielectric material, such as acrylic resin, epoxy resin, polyimide, polyethylene, or silicon oxycarbide (SiOC).

The second inorganic encapsulation layer 146 is formed on the substrate 111, on which the organic encapsulation layer 144 is formed, to cover the upper surfaces and the side surfaces of the organic encapsulation layer 144 and the first inorganic encapsulation layer 142. Consequently, the second inorganic encapsulation layer 146 reduces or prevents external moisture or oxygen from permeating into the first inorganic encapsulation layer 142 and the organic encapsulation layer 144. The second inorganic encapsulation layer 146 is formed of an inorganic dielectric material, such as silicon nitride ($SiN_x$), silicon oxide ($SiO_x$), silicon oxide nitride (SiON), or aluminum oxide ($Al_2O_3$).

Since the encapsulation unit 140 is disposed between a touch-sensing line 154 and the light-emitting element 120 and between a touch-driving line 152 and the light-emitting element 120, the distance between the touch-sensing line 154 and the light-emitting element 120 and between the touch-driving line 152 and the light-emitting element 120 is increased. Consequently, it is possible to reduce the capacitance value of a parasitic capacitor formed between the touch-sensing line 154 and the light-emitting element 120 and between the touch-driving line 152 and the light-emitting element 120, thereby preventing interaction due to coupling between the touch-sensing line 154 and the light-emitting element 120 and between the touch-driving line 152 and the light-emitting element 120. In addition, the encapsulation unit 140 may prevent a liquid chemical (e.g. a developing solution or an etching solution), which is used to form the touch-sensing line 154 and the touch-driving line 152, or external moisture from permeating into the light-emitting stack 124. Consequently, the encapsulation unit 140 may prevent damage to the light-emitting stack 124, which has low resistance to the liquid chemical or to the moisture.

The touch-sensing line 154 and the touch-driving line 152 are disposed on the encapsulation unit 140 to intersect each other in the state in which a touch dielectric film 168 is disposed therebetween. A mutual capacitance Cm is formed at the intersection of the touch-sensing line 154 and the touch-driving line 152. Consequently, the mutual capacitance Cm charges an electric charge by a touch-driving pulse supplied to the touch-driving line 152 and discharges the charged electric charge to the touch-sensing line 154, thereby serving as a touch sensor.

The touch-driving line 152 is connected to a touch-driving unit (not shown) via a routing line 156 and a touch-driving pad 180. In addition, the touch-sensing line 154 is connected to the touch-driving unit via a routing line 156 and a touch-sensing pad 170.

The routing line 156 electrically connects the touch-driving pad 180 and a first touch electrode 152e to each other, and therefore a touch-driving pulse from the touch-driving pad 180 is transmitted to the touch-driving line 152. In addition, the routing line 156 electrically connects the touch-sensing pad 170 and a second touch electrode 154e to each other, and therefore a touch signal from the touch-sensing line 154 is transmitted to the touch-sensing pad 170.

The routing line 156 contacts the side surface of the second inorganic encapsulation layer 146, disposed at the uppermost layer of the encapsulation unit 140, to cover the side surface of the encapsulation unit 140.

The touch-driving pad 180 and the touch-sensing pad 170 are disposed on the lower dielectric film (e.g. the interlayer dielectric film 114) to contact the lower dielectric films 112, 114, and 116, disposed between the substrate 111 and the encapsulation unit 140. Each of the touch-driving pad 180 and the touch-sensing pad 170 includes a pad electrode 172 extending from the routing line 156 and a pad cover electrode 174 formed of a transparent conductive film to cover the pad electrode 172. The touch-driving pad 180 and the touch-sensing pad 170 are formed to be exposed by a cover film 100. Consequently, the touch-driving pad 180 and the touch-sensing pad 170 are connected to a signal transmission film, on which the touch-driving unit is mounted. The cover film 100 is formed to cover the touch-sensing line 154 and the touch-driving line 152, thereby preventing the touch-sensing line 154 and the touch-driving line 152 from being corroded by external moisture. The cover film 100 is configured in the form of a circular polarizer, or is formed of an epoxy or acrylic film.

Meanwhile, the touch-driving line 152 includes a plurality of first touch electrodes 152e and transparent bridges 152b for electrically interconnecting the first touch electrodes 152e.

The first touch electrodes 152e are spaced apart from each other on the touch dielectric film 168 by a predetermined distance in an X direction, which is a first direction. Each of the first touch electrodes 152e is electrically connected to an adjacent first touch electrode 152e via a corresponding one of the transparent bridges 152b.

The transparent bridges 152b are disposed on the touch dielectric film 168, which is disposed in the same plane as the first touch electrodes 152e, to be electrically connected to the first touch electrode 152e without additional contact holes.

The touch-sensing line 154 includes a plurality of second touch electrodes 154e and black bridges 154b for electrically interconnecting the second touch electrodes 154e.

The second touch electrodes 154e are spaced apart from each other on the touch dielectric film 168 by a predetermined distance in a Y direction, which is a second direction. Each of the second touch electrodes 154e is electrically connected to an adjacent second touch electrode 154e via a corresponding one of the black bridges 154b.

The black bridges 154b are formed between the touch electrodes 152e and 154e and the encapsulation unit 140 to contact the encapsulation unit 140. The black bridges 154b are exposed through touch contact holes 150, formed through the touch dielectric film 168, to be electrically connected to the second touch electrodes 154e. In the same manner as the transparent bridges 152b, the black bridges 154b are formed to have a width equal to or less than that of the bank 128 such that the black bridges 154b overlap the bank 128. Therefore, it is possible to prevent the reduction of an aperture ratio due to the transparent and black bridges 152b and 154b.

Each black bridge 154b is disposed on the encapsulation unit 140 between color filters 192 that realize different colors. The black bridge 154b also serves as a black matrix for dividing sub-pixel areas from each other and for preventing optical interference between adjacent sub-pixels and screen bleed. A cell gap between the black bridge 154b, which also serves as a black matrix, and the anode electrode 122 is smaller than a cell gap between a black matrix and an anode electrode of a comparative example, in which the black matrix is disposed on a touch electrode. In this case, the smaller the cell gap, the wider the viewing angle. Therefore, it is possible to secure a wide viewing angle, thereby realizing a high-resolution image.

Figure 4:
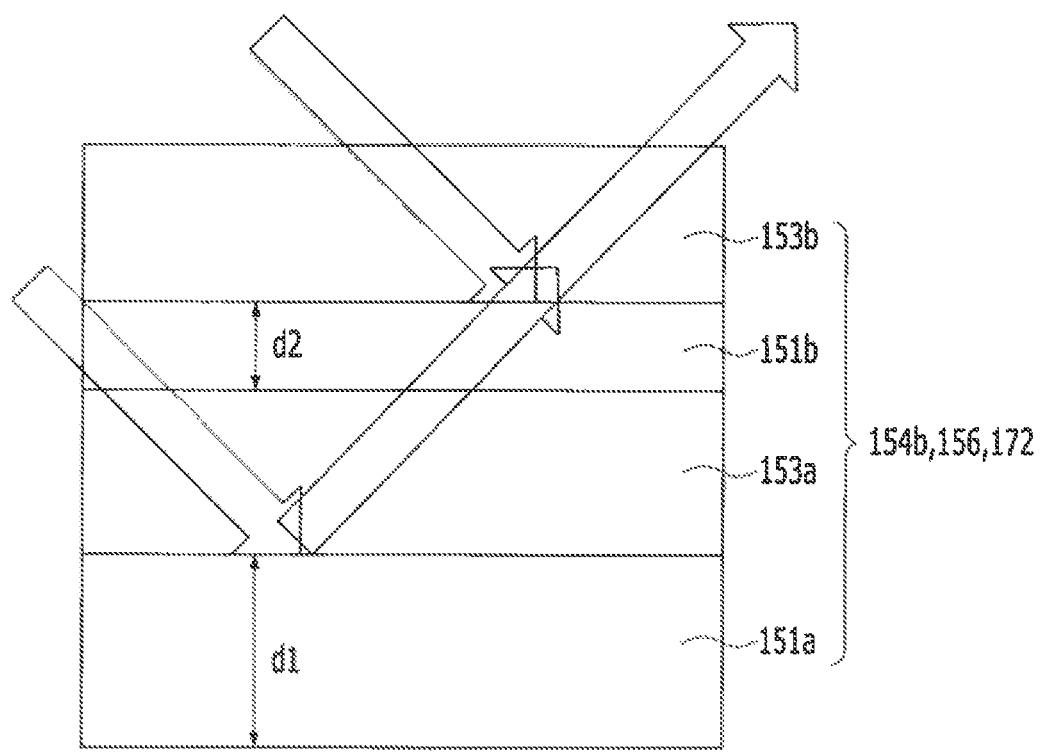
FIG. 4 is a detailed sectional view of a black bridge shown in FIG. 3.

As shown in FIG. 4, the black bridge 154b is formed by at least once alternately stacking oxide thin film layers 153a and 153b and black conductive layers 151a and 151b. For example, the black bridge 154b includes a first black conductive layer 151a, a first oxide thin film layer 153a, a second black conductive layer 151b, and a second oxide thin film layer 153b, which are sequentially stacked on the encapsulation unit 140.

The first black conductive layer 151a is formed of a metal exhibiting high reflectance, and is formed on the second inorganic encapsulation layer 146, which is disposed at the uppermost layer of the encapsulation unit 140. For example, the first black conductive layer 151a is formed of at least one selected from among Cr, Mo, Al, Ag, Au, and Co, and has a single- or multi-layer structure. The first black conductive layer 151a is formed to a first thickness d1, which is greater than the thickness of the second black conductive layer 151b. Consequently, external light is not transmitted to the light-emitting element 120, but is reflected to the second oxide thin film layer 153b. The first black conductive layer 151a is formed to a thickness of 90 to 110 nm.

The second black conductive layer 151b is formed of an opaque metal exhibiting a higher refractive index and absorption coefficient than the first black conductive layer 151a and a higher refractive index than the first and second oxide thin film layers 153a and 153b, and is formed on the first oxide thin film layer 153a. For example, the second black conductive layer 151b is formed of at least one selected from among Cr, Mo, Al, Ag, Au, and Co, and has a single- or multi-layer structure. The second black conductive layer 151b is formed to a second thickness, which is smaller than the first oxide thin film layer 153a, the second oxide thin film layer 153b or the first black conductive layer 151a, thereby transmitting and reflecting external light. The second black conductive layer 151b is formed to a thickness of 5 to 15 nm.

The first and second oxide thin film layers 153a and 153b are formed of a transparent oxide, such as ITO, $TiO_x$, $Al_2O_3$, $ZnO_x$, or $SiO_x$, and are formed to a thickness of about 60 to 100 nm, thereby reducing the reflectance of external light.

The black bridge 154b is formed according to the following embodiments.

Embodiment 1

A first black conductive layer 151a formed of Al to a thickness of 100 nm; a first oxide thin film layer 153a formed of SiO$_2$ to a thickness of 80 nm; a second black conductive layer 151b formed of Cr to a thickness of 8 to 10 nm; a second oxide thin film layer 153b formed of SiO$_2$ to a thickness of 80 nm.

Embodiment 2

A first black conductive layer 151a formed of Al to a thickness of 100 nm; a first oxide thin film layer 153a formed of SiO$_2$ to a thickness of 80 nm; a second black conductive layer 151b formed of Mo to a thickness of 5 to 6 nm; a second oxide thin film layer 153b formed of SiO$_2$ to a thickness of 80 nm.

In the case in which the black bridge 154b has the above structure, external light reflected between the lower interface between the first oxide thin film layer 153a and the first black conductive layer 151a and the upper interface between the first oxide thin film layer 153a and the second black conductive layer 151b has a phase difference of 180 degrees, thereby achieving destructive interference. In addition, external light reflected between the lower interface between the second oxide thin film layer 153b and the second black conductive layer 151b and the upper interface between the second oxide thin film layer 153b and the touch dielectric film 168 has a phase difference of 180 degrees, thereby achieving destructive interference. Consequently, it is possible to prevent external light incident on the organic light-emitting display device having the touch sensor from being reflected by the black bridge 154b, thereby preventing the reduction of visibility.

The color filter 192 is disposed on the substrate 111, on which the first and second touch electrodes 152e and 154e are formed. The color filter 192 realizes a color corresponding to each sub-pixel area. To this end, the red (R) color filter 192 is formed on the first and second touch electrodes 152e and 154e in the red sub-pixel area, the green (G) color filter 192 is formed on the first and second touch electrodes 152e and 154e in the green sub-pixel area, and the blue (B) color filter 192 is formed on the first and second touch electrodes 152e and 154e in the blue sub-pixel area. Meanwhile, a touch planarization film 190 is formed on the substrate 111, on which the color filter 192 is formed. The substrate 111, on which the color filter 192 and the black bridge 154b are formed, is planarized by the touch planarization film 190.

FIGS. 5A to 5D are sectional views illustrating a method of manufacturing the organic light-emitting display device having the touch sensor shown in FIG. 3.

Figure 5A:
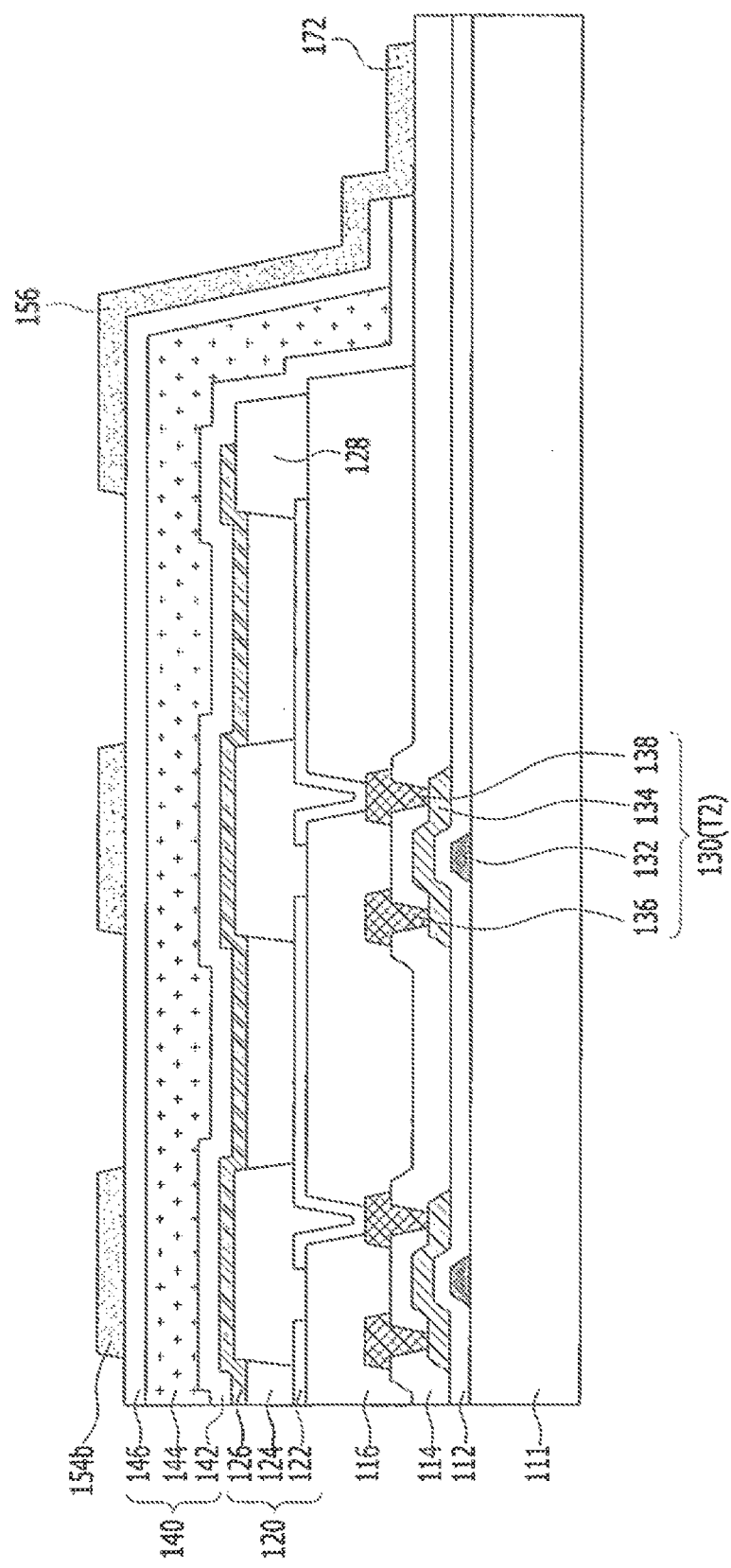

Referring to FIG. 5A, a black bridge 154b, a routing line 156, and a pad electrode 172 are formed on a substrate 111, on which a switching transistor, a driving transistor 130, an organic light-emitting element 120, and an encapsulation unit 140 are formed.

Specifically, a first black conductive layer 151a, a first oxide thin film layer 153a, a second black conductive layer 151b, and a second oxide thin film layer 153b can be stacked on the substrate 111, on which the switching transistor, the driving transistor 130, the organic light-emitting element 120, and the encapsulation unit 140 are formed. Subsequently, the first black conductive layer 151a, the first oxide thin film layer 153a, the second black conductive layer 151b, and the second oxide thin film layer 153b are patterned by photolithography and etching, whereby a black bridge 154b, a routing line 156, and a pad electrode 172 are formed.

Figure 5B:
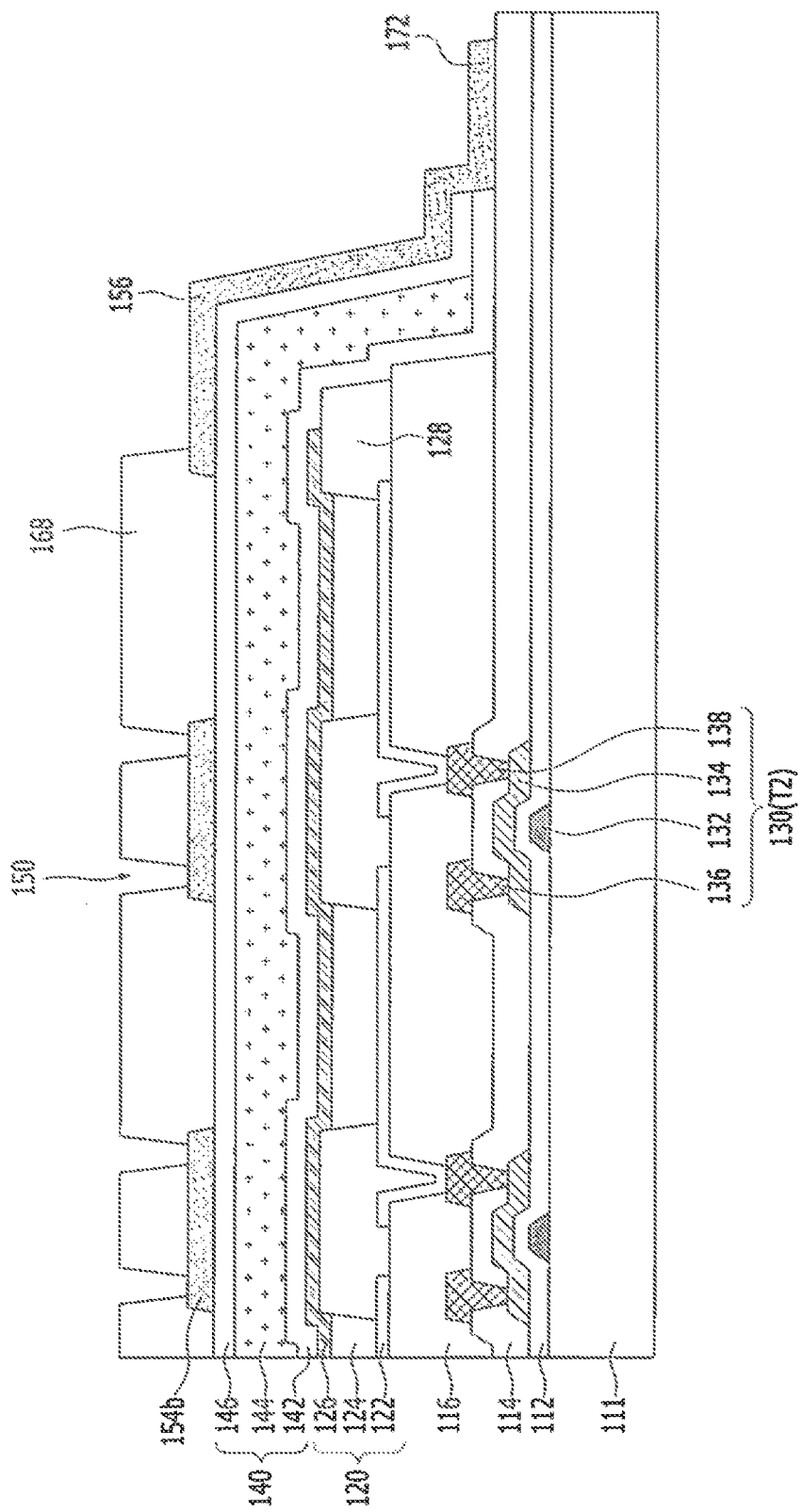

Referring to FIG. 5B, a touch dielectric film 168 having a touch contact hole 150 is formed on the substrate 111, on which the black bridge 154b, the routing line 156, and the pad electrode 172 are formed.

Specifically, an organic dielectric material or an inorganic dielectric material is stacked on the substrate 111, on which the black bridge 154b is formed, whereby a touch dielectric film 168 is formed. The touch dielectric film 168 is patterned by photolithography and etching, whereby a touch contact hole 150 is formed.

Referring to FIG. 5C, a pad cover electrode 174, first and second touch electrodes 152e and 154e, and a transparent bridge 152b are formed on the touch dielectric film 168 having the touch contact hole 150.

Specifically, a transparent conductive layer is deposited over the touch dielectric film 168 having the touch contact hole 150 through a deposition process using sputtering at room temperature. Subsequently, the transparent conductive layer is patterned by photolithography and etching, whereby a pad cover electrode 174, first and second touch electrodes 152e and 154e, and a transparent bridge 152b are formed.

Figure 5D:
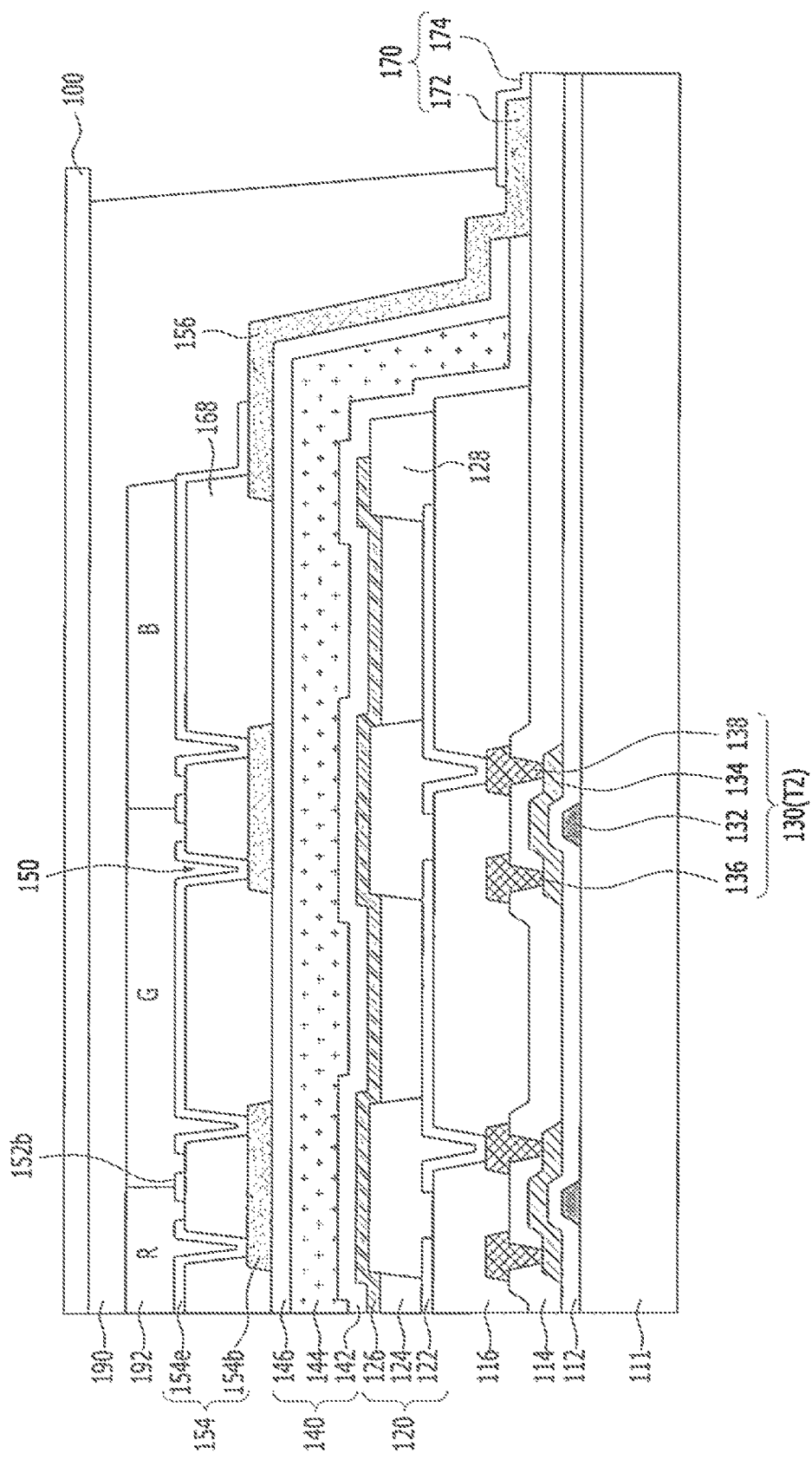

Referring to FIG. 5D, a color filter 192, a touch planarization layer 190, and a cover film 100 are sequentially formed on the substrate 111, on which the first and second touch electrodes 152e and 154e and the transparent bridge 152b are formed.

Specifically, a red color resin is applied to the substrate 111, on which the first and second touch electrodes 152e and 154e and the transparent bridge 152b are formed, and the red color resin is patterned by photolithography, whereby a red (R) color filter 192 is formed. Subsequently, a green color resin is applied to the substrate 111, on which the red (R) color filter 192 is formed, and the green color resin is patterned by photolithography, whereby a green (G) color filter 192 is formed. Subsequently, a blue color resin is applied to the substrate 111, on which the green (G) color filter 192 is formed, and the blue color resin is patterned by photolithography, whereby a blue (B) color filter 192 is formed. Subsequently, an organic film, such as a photo acrylic resin, is applied over the substrate 111, on which the color filters 192 are formed, and the organic film is patterned by photolithography, whereby a touch planarization layer 190 is formed. A cover film, formed of epoxy or acryl, is attached to the substrate 111, on which the touch planarization layer 190 is formed.

In the organic light-emitting display device having the touch sensor according to embodiments of the present invention, as described above, the black bridge, which also serves as a black matrix, is disposed on the encapsulation unit. Consequently, a cell gap between the black bridge and the anode electrode is reduced when compared with a comparative example, thereby securing a wide viewing angle. In addition, in the organic light-emitting display device having the touch sensor according to embodiments of the present invention, the black bridge includes an oxide thin film layer and a black conductive layer. Consequently, it is possible to achieve low reflection, thereby reducing the reflection of external light due to the black bridge without the provision of a polarizing film. In addition, in the organic light-emitting display device having the touch sensor according to embodiments of the present invention, the process of forming the black matrix may be omitted, since the black bridge also serves as a black matrix, thereby reducing material and process costs. Furthermore, in the conventional organic light-emitting display device, a touch-screen is generally attached to the display panel using an adhesive. In contrast, in the organic light-emitting display device according to embodiments of the present invention, the touch electrodes 152e and 154e are disposed on the encapsulation unit 140, with the result that an additional bonding process is not required, whereby the process is simplified and cost is reduced.

Figure 6:
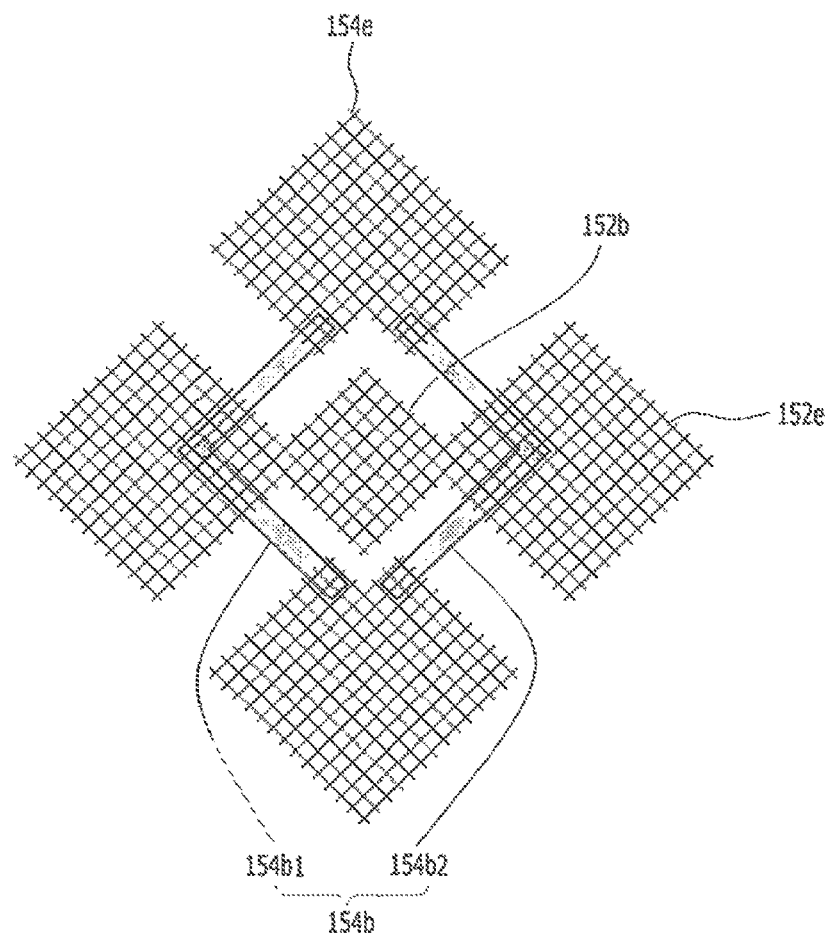
FIG. 6 is plan and sectional views showing another embodiment of the organic light-emitting display device having the touch sensor shown in FIGS. 2 and 3.
Figure 6:
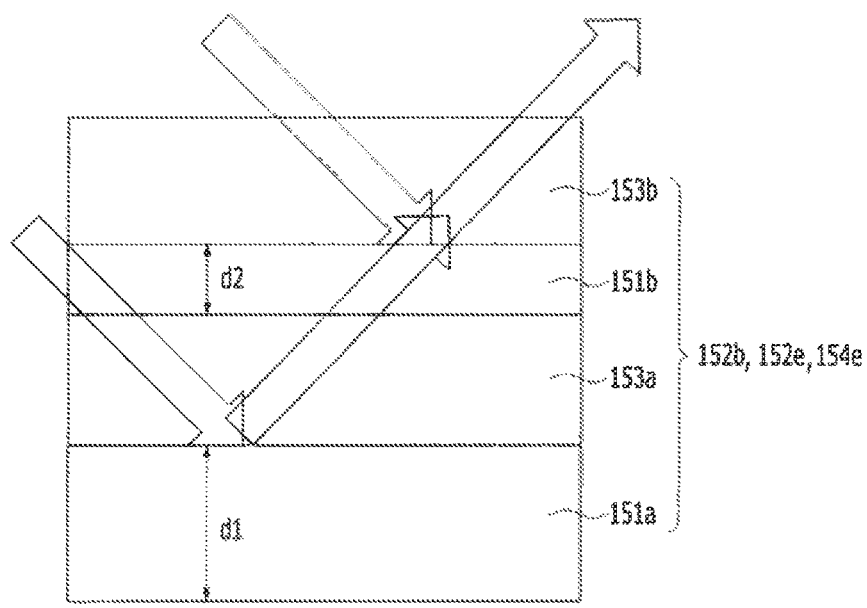

Meanwhile, in embodiments of the present invention, the first and second touch electrodes 152e and 154e are formed in a plate shape, as shown in FIG. 2. Alternatively, the first and second touch electrodes 152e and 154e may be formed in a mesh shape, as shown in FIG. 6. That is, the first and second touch electrodes 152e and 154e and the transparent bridge 152b, which is connected to the first touch electrode 152e, are formed in a mesh shape, including the black conductive layers 151a and 151b included in the black bridge 154. For example, the first and second touch electrodes 152e and 154e and the transparent bridge 152b each include a first black conductive layer 151a, a first oxide thin film layer 153a, a second black conductive layer 151b, and a second oxide thin film layer 153b, in the same manner as the black bridge 154b shown in FIG. 4. Consequently, it is possible to prevent external light incident on the organic light-emitting display device having the touch sensor from being reflected by the first and second touch electrodes 152e and 154e and the transparent bridge 152b, thereby preventing the reduction of visibility. In addition, the line width of the first and second touch electrodes 152e and 154e and the transparent bridge 152b that are formed in the mesh shape is very small, with the result that it is possible to prevent the reduction of an aperture ratio and transmittance due to the first and second touch electrodes 152e and 154e and the transparent bridge 152b.

In addition, one contact point is formed between the black bridge 154b and the second touch electrode 154e, as shown in FIG. 2. Alternatively, two or more contact points may be formed between the black bridge 154b and the second touch electrode 154e, as shown in FIG. 6, in consideration of safety of the connection between the black bridge 154b and the second touch electrode 154e. Consequently, the black bridge 154b includes a first black bridge 154b1 connected to one side of the second touch electrode 154e to bypass one side of the transparent bridge 152b and a second black bridge 154b2 connected to the other side of the second touch electrode 154e to bypass the other side of the transparent bridge 152b. The first black bridge 154b1 and the second black bridge 154b2 can be formed in folding shapes. For example, the first black bridge 154b1 can be formed in a "<", "«" shape etc., and the second black bridge 154b2 can be formed in a ">" "»" shape etc. Consequently, the black bridge 154b does not overlap the mesh-shaped transparent bridge 152b.

As is apparent from the above description, in the display device according to embodiments of the present invention, the black bridge, which also serves as a black matrix, is disposed on the encapsulation unit between the color filters. Consequently, a cell gap between the black bridge and the anode electrode is reduced when compared with a comparative example, thereby securing a wide viewing angle. In addition, the black bridge includes an oxide thin film layer and a black conductive layer. Consequently, it is possible to achieve low reflection, thereby reducing the reflection of external light due to the black bridge without the provision of a polarizing film. In addition, the process of forming the black matrix may be omitted, since the black bridge also serves as a black matrix, thereby reducing material and process costs. Furthermore, the touch electrodes are disposed on the encapsulation unit, with the result that an additional bonding process is not required, whereby the process is simplified and cost is reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
a light-emitting element disposed on a substrate;
an encapsulation unit disposed on the light-emitting element;
a touch sensor having a plurality of first and second touch electrodes disposed on the encapsulation unit, the light-emitting element enclosed in part by the encapsulation unit;
a routing line electrically connected to a corresponding one of the first touch electrodes or the second touch electrodes and disposed to cover a side surface of the encapsulation unit;
a plurality of color filters disposed on the first touch electrodes and the second touch electrodes; and
a plurality of black bridges disposed on the encapsulation unit to electrically connect the plurality of first touch electrodes, and disposed between the color filters,
wherein the black bridges are formed between the first touch electrodes and the encapsulation unit and between the second touch electrodes and the encapsulation unit.

2. The display device according to claim 1, wherein the black bridges include at least one oxide thin film layer and at least one black conductive layer on the encapsulation unit.

3. The display device according to claim 1, wherein the black bridges comprise a first black conductive layer, a first oxide thin film layer, a second black conductive layer, and a second oxide thin film layer on the encapsulation unit.

4. The display device according to claim 2, wherein the at least one oxide thin film layer is formed of at least one transparent oxide selected from among ITO, $TiO_x$, $Al_2O_3$, $ZnO_x$, and $SiO_x$.

5. The display device according to claim 2, wherein the at least one black conductive layer is formed of at least one selected from among Cr, Mo, Al, Ag, Au, and Co, and has a single- or multi-layer structure.

6. The display device according to claim 3, wherein the first black conductive layer is thicker than the second black conductive layer.

7. The display device according to claim 3, wherein the second black conductive layer is thinner than the first black conductive layer, the first oxide thin film layer or the second oxide thin film layer.

8. The display device according to claim 3, wherein the second black conductive layer has a higher refractive index than the first black conductive layer.

9. The display device according to claim 3, wherein at least one of the first oxide thin film layer and the second oxide thin film layer has a lower refractive index than a corresponding one of the first black conductive layer and the second black conductive layer.

10. The display device according to claim 1, wherein the light-emitting element comprises:
an anode electrode disposed on the substrate;
a cathode electrode disposed opposite the anode electrode; and
at least one light-emitting stack disposed between the anode electrode and the cathode electrode, and wherein the black bridges overlap a bank formed to expose the anode electrode.

11. The display device according to claim 10, wherein a width of the black bridge is equal to or less than a width of the bank.

12. The display device according to claim 10, further comprising:
at least one layer of lower dielectric film disposed between the substrate and the encapsulation unit; and
a touch pad electrically connected to the corresponding one of the first touch electrodes or the second touch electrodes via the routing line.

13. The display device according to claim 12, wherein the routing line includes at least one oxide thin film layer and at least one black conductive layer.

14. The display device according to claim 12, wherein the touch pad comprises a pad electrode extending from the routing line and a pad cover electrode on the pad electrode.

15. The display device according to claim 14, wherein the pad electrode comprises at least one oxide thin film layer and at least one black conductive layer.

16. The display device according to claim 1, wherein the first touch electrodes and the second touch electrodes are disposed between the black bridge and the color filters.

17. The display device according to claim 12, further comprising:
a driving transistor connected to the light-emitting element;
a first dielectric film disposed between a gate electrode and an active layer of the driving transistor;
a second dielectric film disposed between the active layer and source and drain electrodes; and
a third dielectric film disposed between the source and drain electrodes and the light-emitting element,
wherein the at least one layer of lower dielectric film is at least one of the first to third dielectric films.

18. The display device according to claim 1, wherein the black bridges comprise:
a first black bridge configured to contact one side of a corresponding one of the first touch electrodes; and
a second black bridge configured to contact another side of a corresponding one of the first touch electrodes, and wherein
at least one of the first black bridges and the second black bridges is formed in a folding shape.

19. The display device according to claim 1, wherein the plurality of black bridges serve as black matrixes.

20. The display device according to claim 18, wherein the first touch electrodes and the second touch electrodes are formed in a mesh shape.

21. The display device according to claim 20, further comprising a mesh-shaped bridge electrically connected to the second touch electrodes.

22. The display device according to claim 21, wherein the first black bridge is disposed to bypass one side of the mesh-shaped bridge, and the second black bridge is disposed to bypass another side of the mesh-shaped bridge.

23. The display device according to claim 18, wherein one of the first and the second black bridges is formed in a "<" shape, and another of the first and the second black bridges is formed in a ">" shape.

24. The display device according to claim 21, wherein the first mesh-shaped touch electrode, the second mesh-shaped touch electrode and the mesh-shaped bridge comprise a first black conductive layer, a first oxide thin film layer, a second black conductive layer, and a second oxide thin film layer.

25. The display device according to claim 1, further comprising:
a touch planarization film formed on the color filters.

* * * * *